United States Patent [19]

Yamamoto et al.

[11] Patent Number: 4,875,098
[45] Date of Patent: Oct. 17, 1989

[54] OUTPUT SIGNAL PROCESSING CIRCUIT FOR CCD REGISTER

[75] Inventors: Isamu Yamamoto; Takashi Asaida, both of Kanagawa, Japan

[73] Assignee: Sony Corporation, Tokyo, Japan

[21] Appl. No.: 256,407

[22] Filed: Oct. 12, 1988

[30] Foreign Application Priority Data

Oct. 20, 1987 [JP] Japan .................................. 62-264808

[51] Int. Cl.[4] .............................................. H04N 5/18
[52] U.S. Cl. .................................. 358/213.16; 358/167
[58] Field of Search .................... 358/213.16, 171, 172, 358/221, 213.1 S, 167

[56] References Cited

U.S. PATENT DOCUMENTS

| | | | |
|---|---|---|---|
| 4,549,215 | 10/1985 | Levine | 358/167 |
| 4,580,170 | 4/1986 | Levine | 358/167 |
| 4,658,305 | 4/1987 | Tsushima | 358/167 |
| 4,734,775 | 3/1988 | Blom | 358/213.16 |
| 4,742,394 | 5/1988 | Dielhof | 358/213.16 |
| 4,786,969 | 11/1988 | Shouji et al. | 358/213.16 |

Primary Examiner—Jin F. Ng
Assistant Examiner—Stephen Brinich
Attorney, Agent, or Firm—Lewis H. Eslinger; Jay H. Maioli; Donald S. Dowden

[57] ABSTRACT

A CCD register, for example a horizontal output register of a CCD imager, includes an output precharge circuit with a capacitance. The voltage across the capacitance is supplied to an output terminal of the CCD register and has first, second and third durations repeatedly. The first duration is a precharge, the second duration is a reference duration, and the third duration is a signal. An output signal processing circuit provided for the CCD register includes a clamp circuit for clamping the output signal at the output terminal of the CCD register in such a manner that the voltage of the reference duration becomes a stable clamp voltage; a clip circuit for clipping the output signal of the clamp circuit in such that the voltage of the precharge duration is clipped to a clip level; and a low-pass filter supplied with the output of the clip circuit for generating a transferred signal.

7 Claims, 9 Drawing Sheets

FIG. 3A PRIOR ART
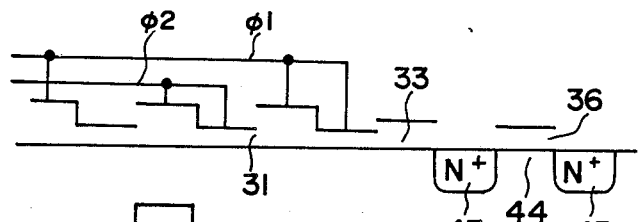
FIG. 3B PRIOR ART   t=t₁
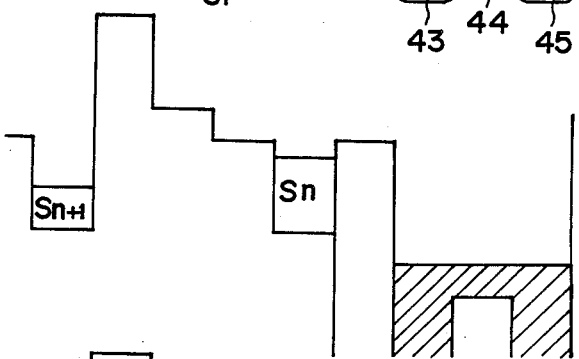
FIG. 3C PRIOR ART   t=t₂
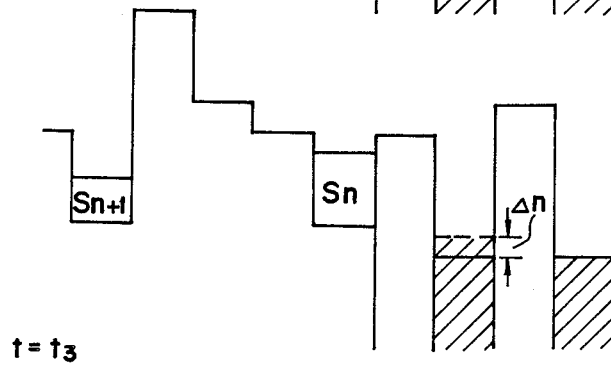
FIG. 3D PRIOR ART   t=t₃
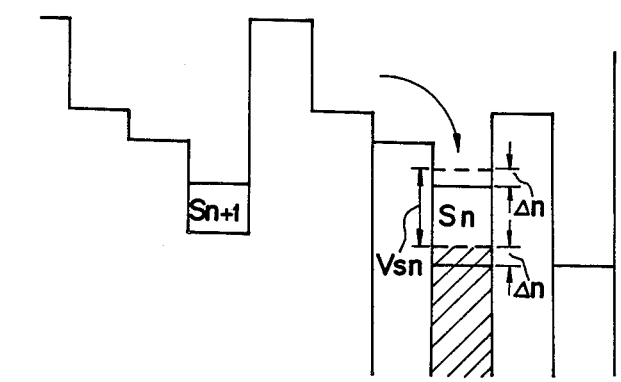

FIG. 4
PRIOR ART
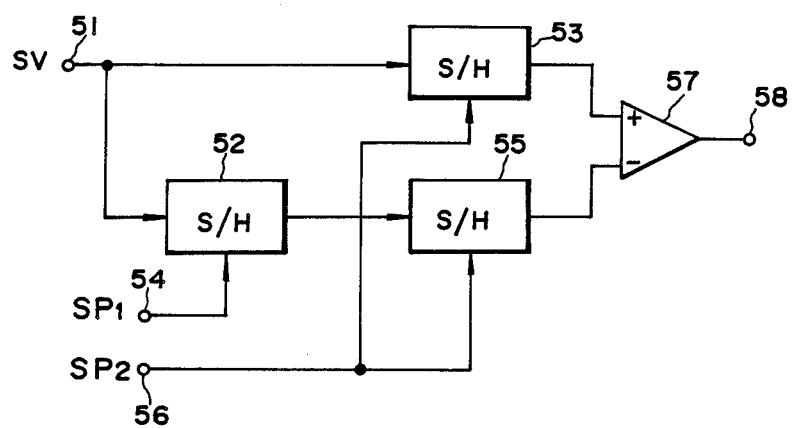
FIG. 5A
PRIOR ART
FIG. 5B
PRIOR ART
FIG. 5C
PRIOR ART
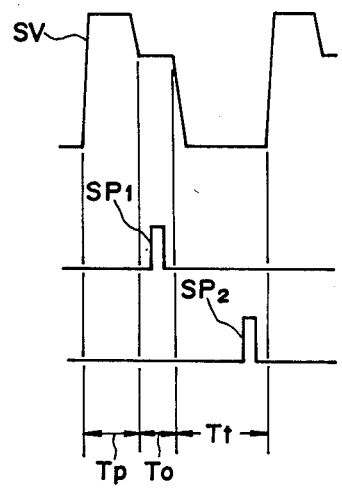

FIG. 7
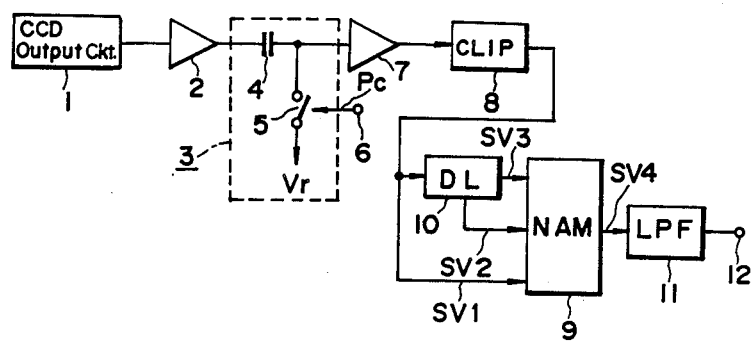
FIG. 9A
FIG. 9B
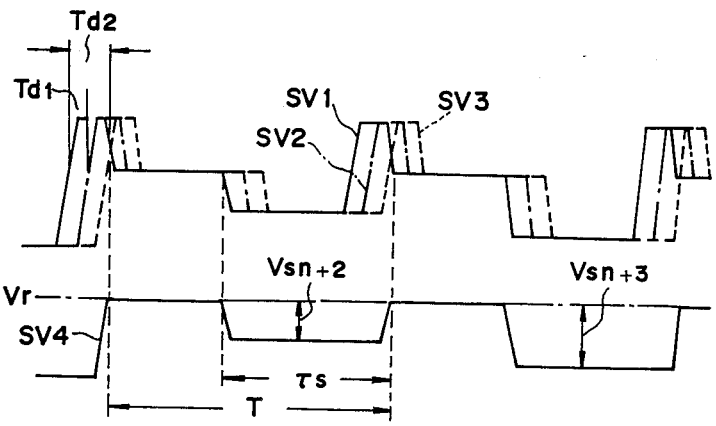
FIG. 10
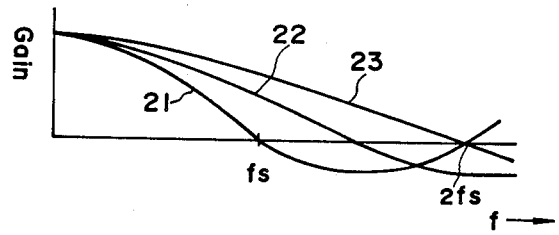

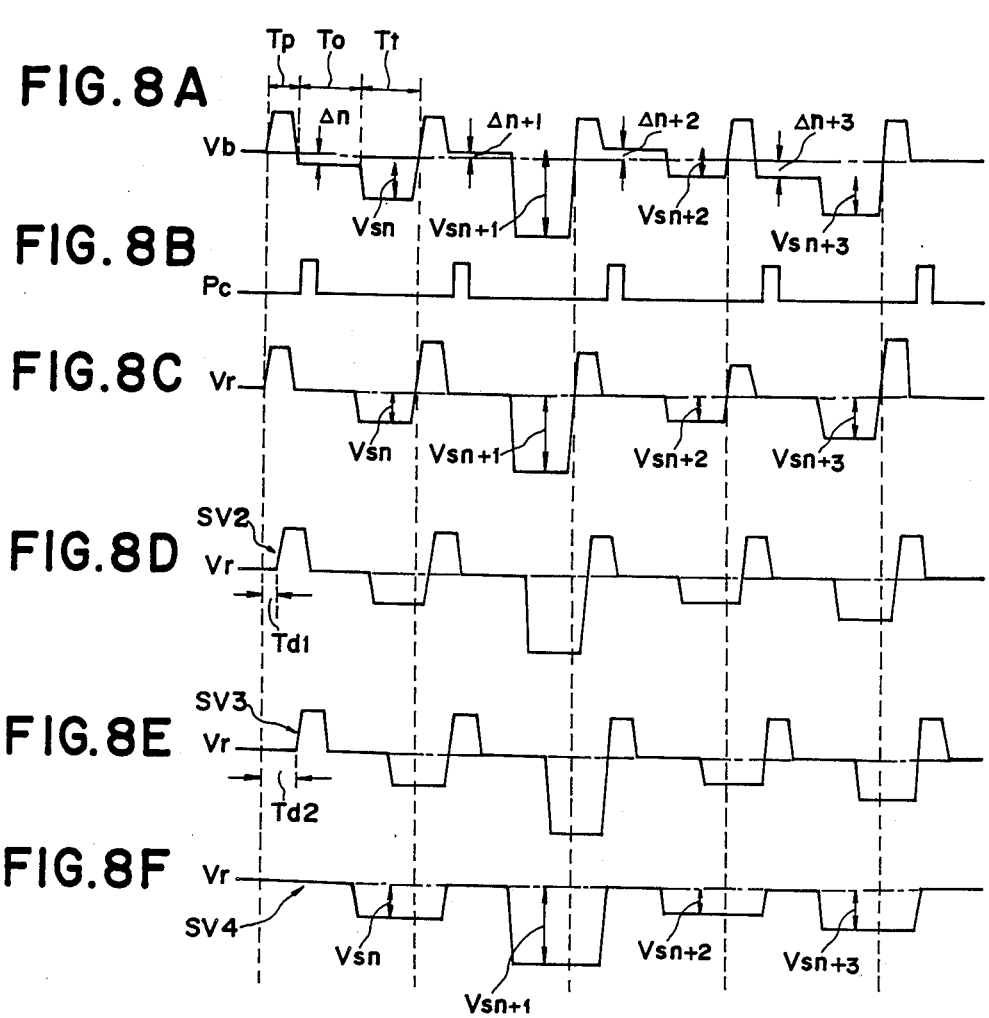

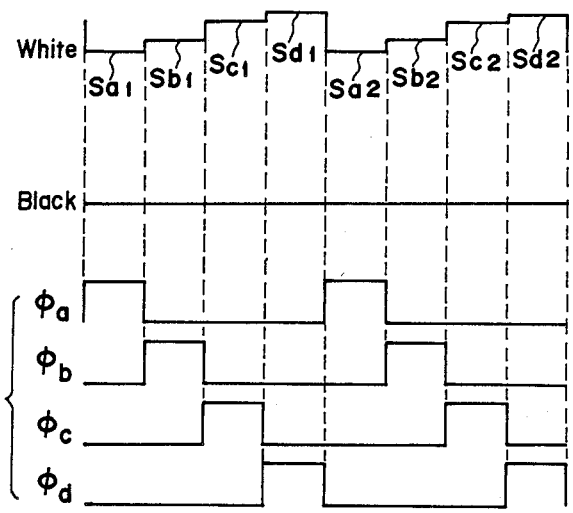

OUTPUT SIGNAL PROCESSING CIRCUIT FOR CCD REGISTER

BACKGROUND OF THE INVENTION

1. Field of the Invention

The present invention relates generally to a CCD circuit and more particularly is directed to an output signal processing circuit for a CCD register.

2. Description of the Prior Art

A solid-state image pickup apparatus comprising charge transfer device such as charge coupled device (CCD) has a photo-sensitive part to perform photoelectric conversion, a charge transfer part to transfer the signal charge obtained in the photo-sensitive part, and an output part for delivering an output signal based on the transferred signal charge. In an interline transfer system, for example, the signal charge from each photoelectric cell is transferred via a transfer gate to a light-shielded vertical register, and the signal charges are sent out sequentially from the vertical registers to light-shielded horizontal registers, so that an image pickup signal is obtained via an output circuit of a CCD register connected to the horizontal registers.

The conventional output circuit of a CCD register known heretofore has a constitution shown in FIG. 1. Denoted by 31 and 33 in this circuit diagram are a horizontal register and a horizontal output gate, respectively. The horizontal register 31 is supplied with, for example, two-phase clock pulses $\phi 1$ and $\phi 2$ from terminals 32A and 32B respectively. Meanwhile the horizontal output gate 33 is supplied with a bias voltage of a predetermined level from a terminal 34. The drain-source of a field effect transistor 36 constituting a floating diffusion amplifier is inserted between the horizontal output gate 33 and a power supply terminal 35, and a capacitor 38 is formed equivalently between the horizontal output gate 33 and the ground. A precharge pulse $P_p$ synchronized with the transfer clock pulses $\phi 1$ and $\phi 2$ is supplied from a terminal 37 connected to the gate of the field effect transistor 36. The image pickup output signal obtained at the junction of the source of the field effect transistor 36 and the capacitor 38 is delivered to an output terminal 42 via a two-stage source follower circuit which consists of field effect transistors 39 and 40, and an emitter follower circuit consisting of a bipolar transistor 41.

FIG. 2 graphically shows the relationship among the two-phase transfer clock pulses $\phi 1$ and $\phi 2$, the precharge pulse $P_p$, and the output voltage Vo produced at one terminal of the capacitor 38.

FIG. 3A shows the electrode structure of the output circuit of FIG. 1, and FIGS. 3B, 3C and 3D show the potentials at different instants t1, t2 and t3 in FIG. 2 respectively. As is obvious from FIG. 3A, the horizontal register 31 has such an electrode structure as to transfer the signal charges Sn, Sn+1 and so forth rightward from the left hand in accordance with the two-phase clock pulses. The field effect transistor 36 has a floating diffusion region 43, a precharge gate 44 and a precharge drain 45 which correspond respectively to the source, gate and drain of the transistor 36 shown in FIG. 1.

Referring now to FIGS. 2 and 3, a description will be given below of how a CCD output signal is taken out. First, the field effect transistor 36 is turned on during the precharge time Tp in which a precharge pulse Pp is supplied to the gate of the field effect transistor 36 in a state where the pulse $\phi 1$ is at a high level while the pulse $\phi 2$ is at a low level. The relationship among the individual potentials at the instant (t=t1) within the precharge time Tp is such that, as shown in FIG. 3B, the potential of the precharge gate 44 is low. When the field effect transistor 36 is turned on, the capacitor 38 is charged immediately by the supply voltage Vb impressed to the terminal 35. And simultaneously the precharge pulse Pp fed to the gate of the field effect transistor 36 appears at the source side thereof through the parasitic capacitance formed substantially between the gate and source of the field effect transistor 36. Consequently, at one terminal of the capacitor 38, there is generated an output voltage Vo where the voltage Vp of the precharge pulse Pl is superimposed on the supply voltage Vb.

The precharge time Tp is followed by a reference potential time To which is immediately before the charge transfer from the horizontal register 31 to the output circuit. In this referential potential time To during which the precharge pulse Pp is at a low level, the field effect transistor 36 is kept in its off-state. Accordingly the output voltage Vo at one terminal of the capacitor 38 is lowered, in comparison with the value during the precharge time To, by the voltage Vp of the precharge pulse Pp to consequently become equal to the supply voltage (reference level) Vb. At the instant (t=t2) in the reference potential time To, as shown in FIG. 3C, the potential of the precharge gate 44 is raised while the potential of the floating diffusion region 43 is rendered equal to the reference potential.

Next to the reference potential time To is a transfer time Tt during which the pulse $\phi 1$ is at a low level and the pulse $\phi 2$ at a high level. In the transfer time Tt, there is obtained an output voltage Vo of the data signal voltage Vs corresponding to the signal charge Sn transferred from the horizontal register 31. The individual potentials at the instant (t =t3) in the transfer time Tt are such as those shown in FIG. 3D. Thus, the signal charge Sn is transferred to the floating diffusion region 43.

When the output voltage Vo is delivered as described above, the charge in the source-drain region (precharge gate region 44) of the field effect transistor 36 is moved between the floating diffusion region 43 and the precharge drain region 45 in the precharge time Tp (FIG. 3D), so that the potential of the floating diffusion region is forcibly equalized to the potential of the precharge drain region 45 and is thereby maintained in a stable state. Consequently the charge state immediately before turn-off of the precharge gate region 44 is not rendered constant, and therefore when the precharge gate region 44 is turned off as shown in FIG. 3C, a reset noise component $\Delta n$ is contained in the floating diffusion region 43. Since the level of such reset noise component $\Delta n$ becomes different depending on the periods, there occurs, among the individual transfer periods, a difference of the referential potential (feed-through level) in the reference potential time To. As a result, when the signal charge Sn is transferred during the transfer time Tt, it follows that, as shown in FIG. 3D, the reset noise $\Delta n$ is superposed on the signal charge Sn and is therefore contained also in the output voltage Vo.

The reset noise mentioned above is termed white noise, and the number Nr of its noise electrons is given by the following equation.

$$Nr = \sqrt{k\,T\,Cf/q}$$

where Cf is the capacitance of the floating diffusion region 43.

In addition to such reset noise, there are so-called 1/f noise and thermal noise generated in the source follower stages of the field effect transistors 39 and 40. In the 1/f noise, the noise level rises in inverse proportion to the frequency. Meanwhile, the thermal noise is high-frequency white noise.

In an attempt to remove such noises, there is proposed a contrivance as disclosed in, for example, Japanese Patent Laid-open No. 56(1981)-116374, wherein a correlated double sampling process is executed for the CCD output signal obtained from a solid-state image pickup apparatus so as to provide a satisfactory output video signal where the harmful influence of the level variation in the reference level portion of the CCD output signal has been compensated for.

FIG. 4 is a block diagram of the output signal processing circuit described in the above Japanese patent publication. In this diagram, a CCD output signal SV of FIG. 5A is fed to an input terminal 51, and the signal SV is further fed to each of sample-and-hold circuits 52 and 53. The circuit 52 samples and holds the CCD output signal SV in accordance with a sampling pulse SP1 of FIG. 5B received from a terminal 54. The sampling pulse SP1 has a phase corresponding to the reference level portion of the CCD output signal SV obtained during the reference potential time To, so that the sample-and-hold circuit 52 produces an output signal coincident in level with the reference level portion in each transfer period. The output signal of the sample-and-hold circuit 52 is fed further to a sample-and-hold circuit 55.

Meanwhile the sample-and-hold circuit 53 performs its operation in accordance with a sampling pulse SP2 of FIG. 5C received from a terminal 56. The sampling pulse SP2 has a phase corresponding to the information signal portion of the CCD output signal SV obtained during the transfer time Tf, so that the sample-and-hold circuit 53 produces an output signal coincident in level with the information signal portion in each transfer period. The output signal of such sample-and-hold circuit 53 is supplied to a subtracter 57. Further in the sample-and-hold circuit 55, the output signal of the circuit 52 is sampled and held in accordance with the sampling pulse SP2, and the output signal of the circuit 55 is supplied also to the subtracter 57.

In the subtracter 57, the output signal of the sample-and-hold circuit 55 is subtracted from that of the sample-and-hold circuit 53. Consequently, at an output terminal 58 connected to the output of the subtracter 57, there is obtained an output video signal posterior to removal of any level variation derived from the level variation in the reference level portion of the CCD output signal SV.

There is known another conventional constitution as disclosed in U.S. Pat. No. 3,781,574 where a reference level portion is clamped at a predetermined potential, then the image pickup output signal thus clamped is fed to a sample-and-hold circuit, and subsequently the level of the information signal portion is sampled and held.

The output signal processing circuit for each of such conventional CCDs is effective for removing the aforementioned reset noise and 1/f noise. However, since both of such known circuits are of the type that samples and holds also the high-frequency component above the Nyquist frequency, there occurs deterioration in the signal-to-noise ratio due to the aliasing of the high-frequency noise (thermal noise component). For the purpose of solving the above problem, there is proposed an integrated type correlated double sampling method described in "Journal of Television Society", Vol. 39, No. 12 (1985), pp. 1176 (38)–1181 (43). According to this system, the level of the reference level portion and that of the information signal portion are integrated respectively for a predetermined time, and the difference between the two integral values is calculated to achieve simultaneous removal of both the high-frequency noise component and the reset noise. Each of the integrating circuits is equipped with a reset switch actuated per period. The above integrated type correlated double sampling method is effective also for enhancing the modulation transfer function (MTF).

The aforementioned CCD output circuit shown in FIG. 1 serves as a charge-to-voltage converter which converts into a signal voltage the signal charge transferred cyclically from the CCD register. The CCD output signal obtained from the CCD output circuit contains an information signal voltage proportional to the charge stored per pixel discretely. FIG. 6A shows a discrete series of the CCD output signal per transfer period thereof, and FIG. 6B shows a frequency spectrum of the CCD output signal. As is obvious from FIG. 6B, the CCD output signal contains both a baseband component 46 and higher harmonic components 47 derived from the sampling.

As shown in FIG. 6C, the discrete CCD output signal is normally held until appearance of the information signal voltage of the next period in a manner termed zero-order hold. Due to such holding action, the information signal voltage of a discrete value is rendered processible as an ordinary baseband video signal. On the other hand, however, such holding action causes a disadvantage that, as represented by a one-dot chain line in FIG. 6D, the CCD output signal is affected by the sine function characteristic 48 where the sampling frequency fs (=1/T) is an initial zero with a curve expressed as $\sin(\pi f/fs)/(\pi f/fs)$, so that the modulation transfer function (MTF) in the vicinity of the frequency fs is deteriorated by the low-pass characteristic of the sine function to the band below the frequency fs.

According to the aforementioned integrated type correlated double sampling method which executes chopping of the CCD output signal by a reset switch, there is generated an output signal of the waveform shown in FIG. 6E. Supposing that the pulse has a duration $\tau$ in FIG. 6E, there occurs a low-pass characteristic 49 where the frequency $1/\tau$ is an initial zero as represented by a one-dot chain line in FIG. 6F. Such sine function characteristic 49 has a curve expressed as $\sin(\pi f\tau)/(\pi f\tau)$, and its pass band is wider than that of the aforesaid sine function characteristic 48 shown in FIG. 6D, thereby preventing deterioration of the modulation transfer function in the vicinity of the frequency fs.

In the integrated type correlated double sampling that employs a reset switch, sufficient stability of the reset pulse itself is strictly required for actuating the reset switch. Therefore, troubles of fixed-pattern noise and shading are prone to occur due partially to modulation of a power supply for a reset pulse generator, and the noise is increased by jitters of reset pulses with another problem of harmful influence from interference of external electromagnetic waves and so on.

OBJECTS AND SUMMARY OF THE INVENTION

Accordingly, it is an object of the present invention to provide an improved output signal processing circuit for a charge coupled device which can obviate the shortcomings encountered in the prior art.

Another object of the present invention is to provide an improved output signal processing circuit for a charge coupled device which is free from aliasing noise caused by a thermal noise.

A further object of the present invention is to provide an improved output signal processing circuit for a charge coupled device which can prevent the deterioration of the MTF in a higher frequency band of the output signal.

And a still further object of the present invention is to provide an improved output signal processing circuit for a charge coupled device which generates less undesired radiation.

According to an aspect of the present invention, there is provided an output signal processing circuit for a charge coupled device, in which an output signal of a CCD register is clamped such that the level of a reference duration becomes a stable clamp level, and the level of a precharge duration is so clipped as to become substantially equal to the clamp level, and the output signal of the clip circuit is supplied to an LPF to eliminate a sampling frequency component.

The output signal of the clip circuit contains an information signal voltage which is translated through a CCD register with a pulse width $\tau$ per period T. Thus, the information signal with a pulse width $\tau$ less than a transfer period T can be obtained without using a circuit with a reset function, thereby preventing any deterioration of the MTF that may otherwise be caused in a higher frequency band of the information signal. And a stable circuit construction that can be realized as a reset type circuit is not used.

These and other objects, features and advantages of the present invention will become apparent from the following detailed description of the preferred embodiments to be taken in conjunction with the accompanying drawings.

BRIEF DESCRIPTION OF THE DRAWINGS

FIG. 3A-3D shows the configuration of and the potentials in the circuit of FIG. 1 for explaining the operation performed therein;

FIG. 4 is a block diagram of a conventional output signal processing circuit for a CCD;

FIG. 5A-5C shows signal waveforms for explaining the operation in the circuit of FIG. 4;

FIG. 7 is a block diagram of an exemplary embodiment according to the present invention;

FIGS. 8A-8F, 9A-9B and 10 show signal waveforms for explaining the operation in the embodiment of FIG. 7;

FIG. 10 is a block diagram of another embodiment according to the present invention;

FIGS. 13A-13E, 14A-14H, and 15A-15B show signal waveforms for explaining the operation in the embodiment of FIG. 11.

DETAILED DESCRIPTION OF THE PREFERRED EMBODIMENTS

Figure 1:
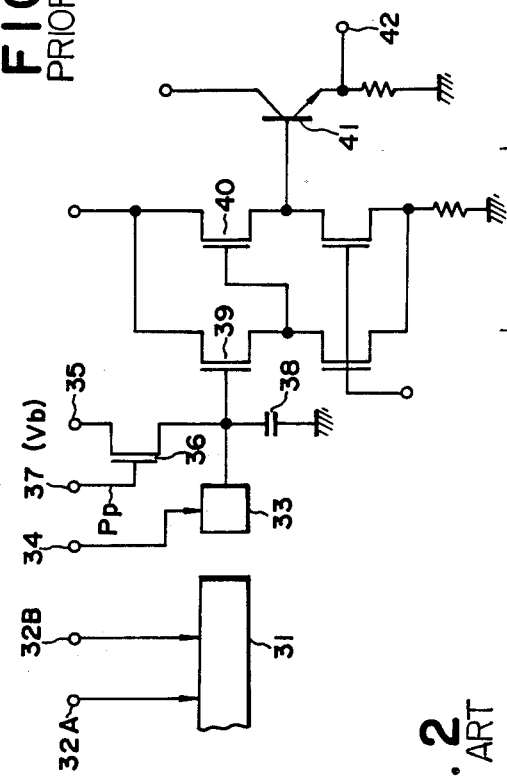
FIG. 1 is a circuit diagram of a general conventional CCD output circuit.

Hereinafter an exemplary embodiment of the present invention will be described with reference to the accompanying drawings. In FIG. 7, reference numeral 1 denotes the CCD output circuit shown in FIG. 1. The output signal of such CCD output circuit 1 is supplied via an amplifier 2 to a clamp circuit 3 enclosed with a broken line. The CCD output circuit 1 consists of a floating diffusion amplifier and a source follower circuit, and is connected to a horizontal shift register of, for example, an interline type solid-state image pickup apparatus.

The output signal of the amplifier 2 has a voltage waveform of FIG. 8A corresponding to the precharge time Tp, reference potential time To and transfer time Tt respectively in one period of transfer clock pulses. The individual times Tp, To and Tt are determined in accordance with the level relationship between the precharge pulse and the two-phase clock pulses fed to the horizontal shift register. A field effect transistor constituting the floating diffusion amplifier is turned on during the precharge time Tp, so that the level of the output signal becomes the sum (Vb + Vp) of the supply voltage Vb and the precharge pulse voltage Vp. In the next reference potential time To, the precharge pulse is turned to a low level and the field effect transistor is placed in its off-state. At this moment the level of the output signal becomes equal to the supply voltage (reference level) Vp. And in the following transfer time Tt, the signal charge is transferred from the horizontal register to the floating diffusion region, whereby the level of the output signal is changed as Vb − Vsn where Vsn is the information signal voltage. The above operation is repeated to sequentially generate information signal voltages Vsn+1, Vsn+2 and so forth.

Since the charge state is not fixed immediately before the field effect transistor is turned off from its on-state, the reference level during the reference potential time To fails to be coincident with the supply voltage Vb, whereby differences are caused among the individual transfer periods to consequently generate reset noises Δn, Δn+1, Δn+2 and so forth.

The clamp circuit 3 comprises a capacitor 4, a switching element 5 and a voltage source (not shown) for producing a clamp voltage Vr, wherein the switching element 5 is turned on or off by a clamp pulse Pc from a terminal 6. The clamp pulse Pc is at a high level during the reference potential time To as shown in FIG. 8B, and the switching element 5 is turned on in the high-level duration of the clamp pulse Pc. The level during the reference potential time To is clamped to the clamp voltage Vr by such clamp circuit 3. Accordingly, as shown in FIG. 8C, the reset noises Δn, Δn+1 and so forth are removed by the clamp circuit 3.

The output signal of the clamp circuit 3 is fed via a buffer amplifier 7 to a clip circuit 8. Since a new level variation is caused during the precharge time Tp by the clamp circuit 3, the clip circuit 8 serves to remove such new level variation.

The output signal SV1 of the clip circuit 8 is fed to both a non-additive mixer 9 and a delay circuit 10. The output signal SV1 of the clip circuit 8 is coincident in phase with the output signal of the clamp circuit 3 shown in FIG. 8C. The delay circuit 10 produces a delay signal SV2 having a delay Td1 with respect to the non-delay signal SV1 as shown in FIG. 8D, and another delay signal SV3 having a delay Td2 as shown in FIG. 8E. The delay signals SV2 and SV3 are fed also to the nonadditive mixer 9, which then outputs the minimal-level one of the three input signals SV1, SV2 and SV3 selectively, so that a combined data signal SV4 of FIG. 8F is obtained from the non-additive mixer 9. In an exemplary circuit configuration of the non-additive mixer 9, emitters of three pnp-type transistors are connected in common to a regulated constant-current source while the collectors thereof are connected in common to one another, and an output is obtained from the common junction of the emitters. The combined information signal SV4 is fed to a low-pass filter 11 for trapping the sampling-frequency component, and a CCD output signal therefrom is delivered to the output terminal 12 of the low-pass filter 11.

FIG. 9A partially shows the waveforms of the input signals SV1 (solid line), SV2 (one-dot chain line) and SV3 (broken line) fed to the non-additive mixer 9. The respective minimal-level portions of such signals SV1, SV2 and SV3 are combined with one another so that, as shown in FIG. 9B, the pulse portions in the precharge time Tp are removed, and simultaneously there is produced a combined information signal SV4 which sequentially contains the information signal voltages Vsn, Vsn+1 and so forth based on the clamp voltage Vr. The holding time $\tau s$ for each of such information signal voltages Vsn, Vsn+1 and so forth is selected to have the permissible maximum duration within a range where the value of $\tau s/T$ is smaller than $\frac{2}{3}$ of the transfer period (sampling period) T. The duration of the holding time $\tau s$ can be set by the delay times Td1 and Td2 of the delay circuit 10. In a modification, such delay times Td1 and Td2 of the delay circuit 10 may be rendered changeable.

The purpose of limiting the value of $\tau s/T$ to less than $\frac{2}{3}$ resides in preventing deterioration of the modulation transfer function in a higher frequency band of the output signal. Similarly to the aforementioned case of the sample-and-hold action, the influence of the low-pass filter characteristic is exerted due to extraction of the information signal voltage by the non-additive mixer 9. Denoted by 21 in FIG. 10 is a function characteristic curve where the sampling frequency fs (=1/T) is an initial zero. Such function characteristic 21 occurs under the condition of $\tau s/T = 1$, and it reduces the high-frequency component of the CCD output signal to consequently bring about deterioration of the modulation transfer function in a higher frequency band of the signal. Meanwhile, sine function characteristic 22 in FIG. 4 occurs under the condition of $\tau s/T = \frac{2}{3}$, and another sine function characteristic 23 occurs under the condition of $\tau/T = \frac{1}{2}$. The modulation transfer function in a higher frequency band is not deteriorated when the sine function characteristic is in such a degree as represented by a curve 22.

If the clip circuit 8 in FIG. 7 is capable of completely clipping the pulse of the precharge pulse time Tp and thereby substantially equalizing the level during such time to the clamp voltage Vr, the delay circuit 10 and the non-additive mixer 9 are not necessary.

The present invention is applicable also to a solid-state color camera using three CCD chips. In one conventional example employing three CCD chips to constitute a solid-state color camera, the light from a subject is decomposed into three primary colors by a color separation optical system, and the CCD chips are disposed on the respective focal planes of the three primary colors. In the solid-state color camera of such type, a technique of spatial pixel deviation is proposed for enhancing the resolution. This contrivance is based on the means of first deviating the green CCD spatially by $\frac{1}{2}$ pixel pitch from the red and blue CCDs and, after reading out such CCDs in accordance with a common clock signal, delaying the green image pickup signal for a time $\frac{1}{2}$ T from the blue and green image pickup signals, thereby extending the luminance signal band equivalently twice in the spatial sampling. In this case, a delay circuit for delaying the green image pickup signal for a time $\frac{1}{2}$ T may be inserted between a non-additive mixer 9 and a low-pass filter 11 in an output circuit similar to the one employed in the foregoing embodiment of FIG. 7.

It is to be understood that the present invention is applicable not merely to a charge transfer device for constituting a solid-state image pickup apparatus, but also to a circuit for processing signals obtained from any of charge transfer devices used for other various purposes.

According to the present invention where none of sample-and-hold circuit is employed, it becomes possible to prevent deterioration of the signal-to-noise ratio that may otherwise be caused by the aliasing of high-frequency noise (thermal noise component), with another advantage of raising no problem with regard to spurious radiation. Furthermore, the present invention is capable of averting deterioration of the modulation transfer function in a higher frequency band of the output signal due to the waveform returned to its reference level, as in the aforesaid integrated type correlated sampling process. In addition, the circuit configuration of the present invention can be simplified with sufficient stability since any high-precision reset pulse is not required differently from the known integrated type correlated double sampling.

Figure 12:
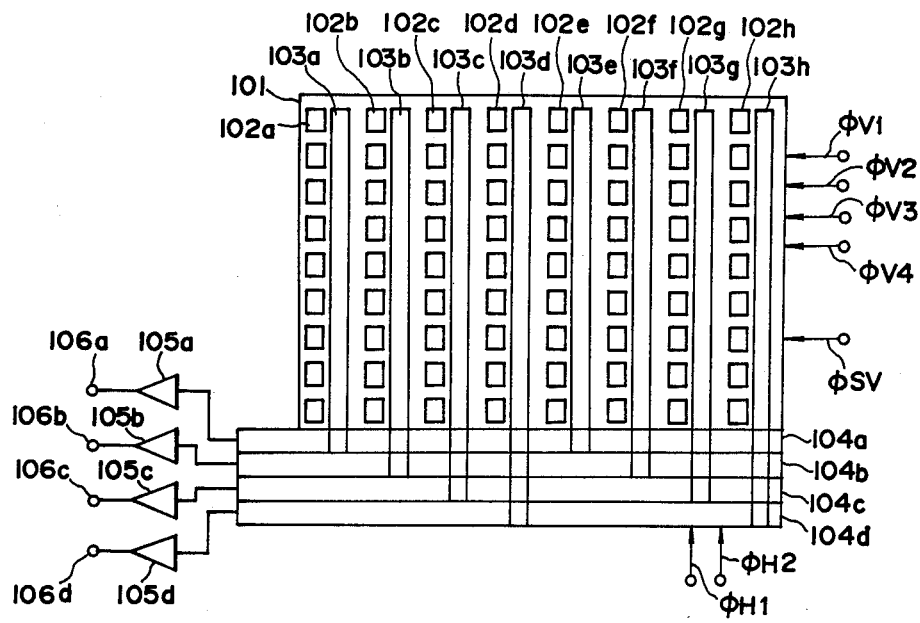
FIG. 12 shows the constitution of a solid-state image pickup device employed in the embodiment of FIG. 11.

Hereinafter a description will be given of another embodiment of the present invention applied to a solid-state image pickup device having a plurality of horizontal registers. In this embodiment, as shown in FIG. 12, there is employed a solid-state image pickup device of interline transfer system having, for example, four horizontal registers 104a, 104b, 104c and 104d. In FIG. 12, denoted by 101 is a p-type silicon substrate, and photo-sensitive elements 102a, 102b, 102c, . . . consisting of photodiodes are arranged into a matrix on the surface of the p-type silicon substrate 101. Although simplified in FIG. 12, a multiplicity of such photo-sensitive elements 102a, 102b, 102c . . . are arrayed to form a matrix of 2000×1000 in an example of high-definition (HD) television color camera. And light-shielded vertical registers 103a, 103b, 103c . . . are disposed in the proximity of the photo-sensitive elements 102a, 102b, 102c and so forth. The four horizontal registers 104a, 104b, 104c and 104d are provided in connection with the vertical registers 103a, 103b, 103c and so forth.

Four of such vertical registers 103a, 103b, 103c . . . are selectively connected to the horizontal registers 104a, 104b, 104c and 104d. Suppose now that, for the purpose of simplifying the explanation, eight vertical registers 103a, 103b, 103c . . . are provided in all. In this example, the 1st vertical register 103a and the 5th vertical register 103e are connected to the horizontal register 104a; the 2nd vertical register 103b and the 6th vertical register 103f are connected to the horizontal register 104b; the vertical registers 103c and 103g to the horizontal register 104c; and the vertical registers 103d and 103h to the horizontal register 104d, respectively. During the vertical blanking interval, signal charges are read out from the photo-sensitive elements 102a, 102b, 102c . . . to the vertical registers 103a, 103b, 103c . . . in response to a gate pulse $\phi$sv. The signal charges are transferred to the vertical registers 103a, 103b, 103c . . . by four-phase clock pulses $\phi$V1, $\phi$V2, $\phi$V3 and $\phi$V4, and then are inputted into the horizontal registers 104a, 104b, 104c and 104d during the horizontal blanking interval. Two-phase transfer clock pulses $\phi$H1 and $\phi$H2 are fed to the horizontal registers 104a, 104b, 104c and 104d so that, during the horizontal video interval, the signal charges are read out from the horizontal registers 104a, 104b, 104c and 104d.

The signal charges thus obtained from the horizontal registers 104a, 104b, 104c and 104d are supplied to output amplifiers 105a, 105b, 105c and 105d and then are taken out in the form of video signal voltages from output terminals 106a, 106b, 106c and 106d. The output amplifiers 105a, 105b, 105c and 105d consist of, for example, floating diffusion amplifiers and source follower transistors.

Figure 13A:
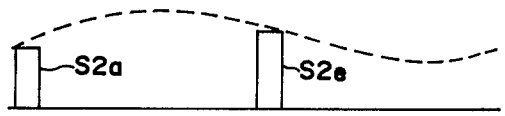
Figure 13B:
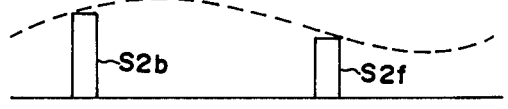
Figure 13C:
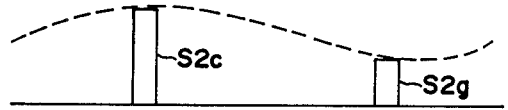
Figure 13D:
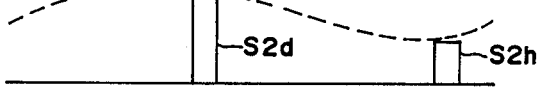
Figure 13E:

FIG. 13A typically shows the signal voltage taken out from the output terminal 106a. Similarly, FIGS. 13B, 13C and 13D typically show the signal voltages taken out from the output terminals 106b, 106c and 106d, respectively. Signal voltages S2a and S2e corresponding respectively to the photo-sensitive elements 102a and 102e are obtained from the output terminal 106a correspondingly to the signal charges obtained from the photo-sensitive elements 102a to 102h in FIG. 12. Similarly, signal voltages S2b and S2f corresponding to the photo-sensitive elements 102b and 102f are obtained from the output terminal 106b; signal voltages S2c and S2g corresponding to the photo-sensitive elements 102c and 102g are obtained from the output terminal 106c; and signal voltages S2d and S2h corresponding to the photo-sensitive elements 102d and 102h are obtained from the output terminal 106d. The output signals of such four horizontal registers 104a, 104b, 104c and 104d are combined with one another by a non-additive mixer, as will be described later, to become a video output signal shown in FIG. 13E.

As is understood from the above description, due to the provision of N pieces of horizontal output registers, the signal charge transfer frequency in the horizontal registers is reduced to 1/N. Consequently, in a color camera for high-definition television where the number of pixels is great, the signal charges can be read out with more facility in comparison with the foregoing case of employing a single horizontal register.

Figure 11:
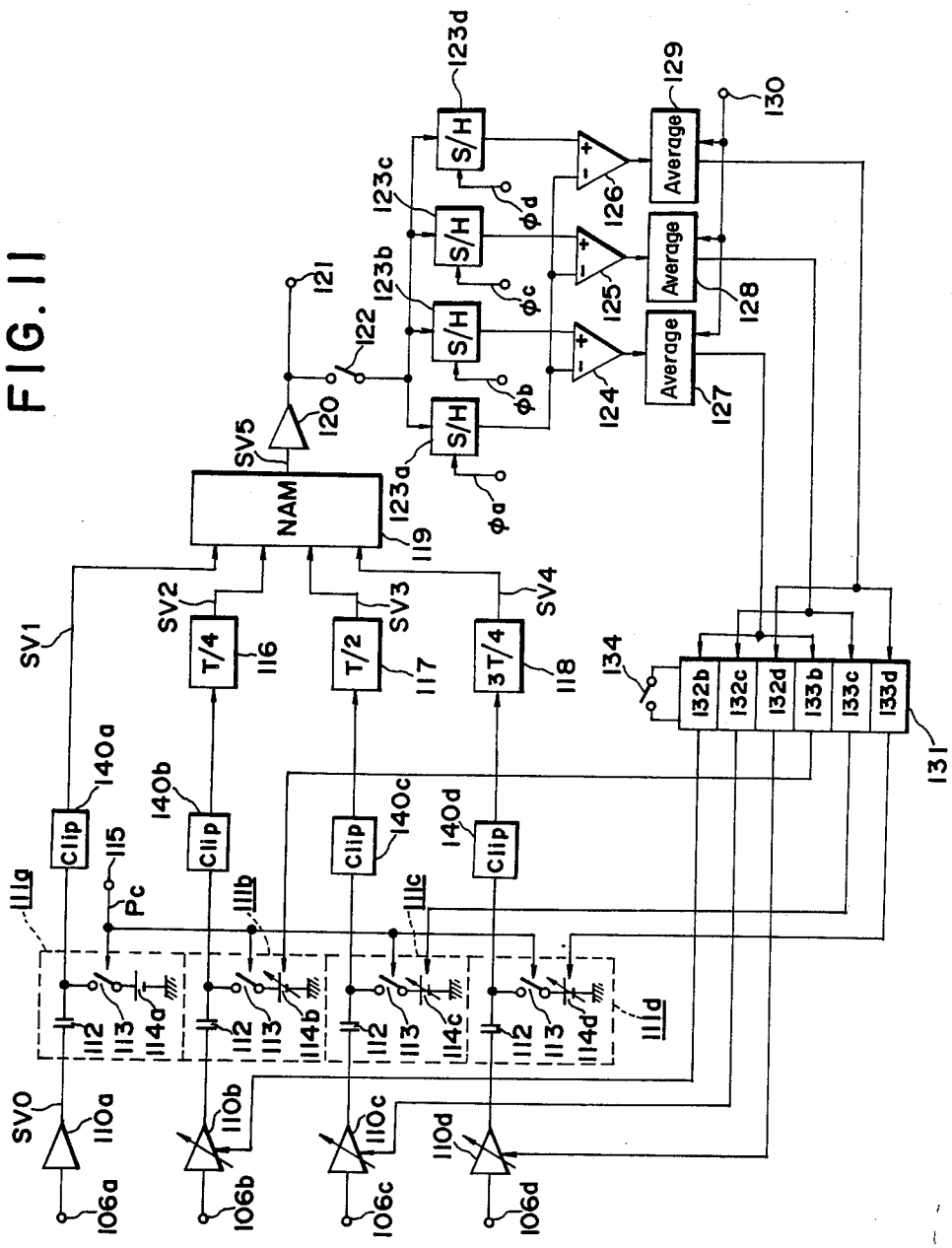

Now the above embodiment will be described in further detail with reference to FIG. 11. An amplifier 110a, a variable-gain amplifier 110b, a variable-gain amplifier 110c and a variable-gain amplifier 110d are connected respectively to the output terminals 106a, 106b, 106c and 106d of the solid-state image pickup device having four horizontal registers as described. The variable-gain amplifiers 110b, 110c and 110d are provided to compensate for the gain dispersions resulting from the differences among the capacities of the respective floating diffusion regions in the output amplifiers 105a, 105b, 105c and 105d, as will be described later.

The output signal $SV_O$ of the amplifier 110a is supplied to a clamp circuit 111a enclosed with a broken line. The clap circuit 111a comprises a capacitor 112 inserted in series to the signal path, a switching element 113 inserted between one end of the capacitor 112 and the ground, and a fixed voltage source 114a for generating a clamp voltage. The output signals of the variable gain amplifiers 110b, 110c and 110d are supplied respectively to clamp circuits 111b, 111c and 111d enclosed with dotted lines. Such clamp circuits 111b, 111c and 111d each comprises a capacitor 112 and a switching element 113 in the same manner as the aforesaid clamp circuit 111a, and also variable voltage sources 114b, 114c and 114d, respectively. As will be described later, the variable voltage sources 114b, 114c and 114d are provided for correcting the black level dispersions. The switching elements 113 of the clamp circuits 111a to 111d are controlled by clamp pulses Pc fed from a terminal 115.

An output signal SV1 of the clamp circuit 111a is supplied via a clip circuit 140a to a non-additive mixer 119. Meanwhile an output signal of the clamp circuit 111b is supplied via a clip circuit 140b to a delay circuit 116, whose output signal SV2 is then supplied to the non-additive mixer 119. An output signal of the clamp circuit 111c is supplied via a clip circuit 140c to a delay circuit 117, whose output signal SV3 is then supplied to the non-additive mixer 119. And an output signal of the clamp circuit 111d is supplied via a clip circuit 140d to a delay circuit 118, whose output signal SV4 is then supplied also to the non-additive mixer 119. Such clip circuits 140a to 140d are provided for removing the precharge pulse components contained in the respective output signals of the clamp circuits.

The delay circuit 116 has a delay of T/4, in which T represents the transfer period of the information signal voltage in the output signal obtained from one horizontal register of the solid-state image pickup device. Meanwhile the delay circuit 117 has a delay of T/2, and the delay circuit 118 has a delay of 3T/4. The non-additive mixer 119 outputs the minimal level out of the four input signals SV1, SV2, SV3 and SV4. An exemplary circuit configuration of the non-additive mixer 119 is such that emitters of four pnp-type transistors are connected to a common constant current source while collectors thereof are connected in common to one another, and the output is obtained from the common junction of the emitters. The video information signal SV5 from the non-additive mixer 119 is delivered via an amplifier 120 to an output terminal 121.

Figure 2:
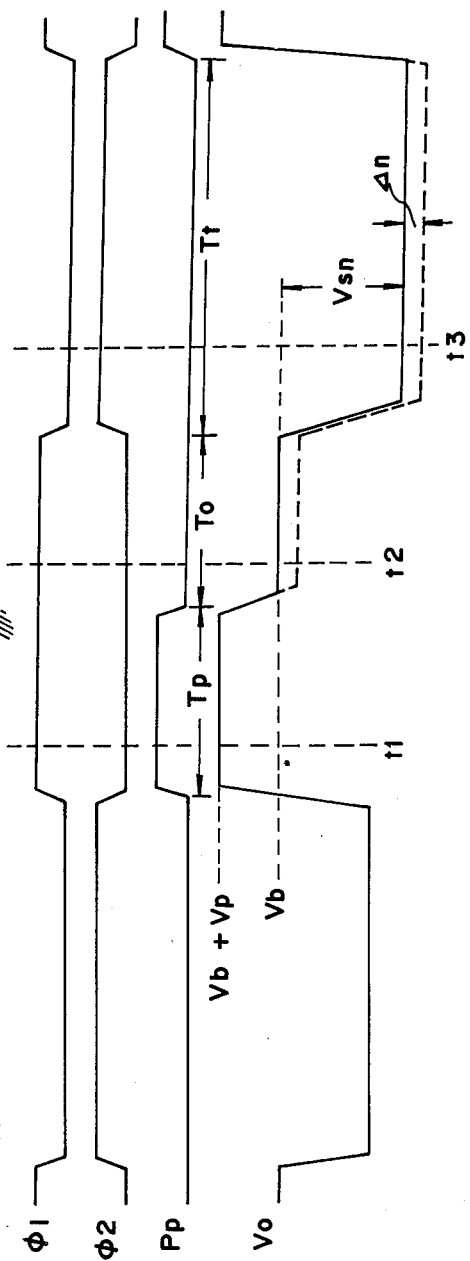
FIG. 2 is a waveform chart for explaining the operation in the circuit of FIG. 1.
Figure 6B:
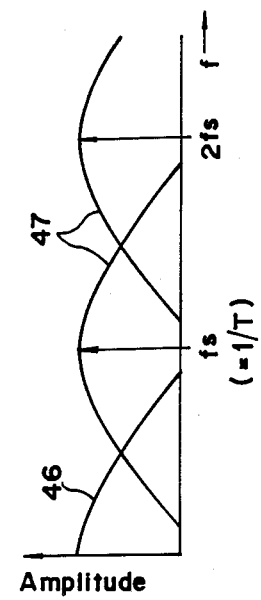
FIGS. 6A-6F is a timing chart to explain the operation in another conventional example.
Figure 6D:
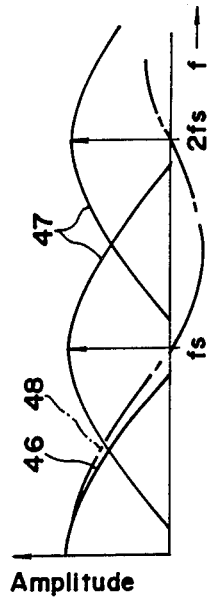
Figure 6F:
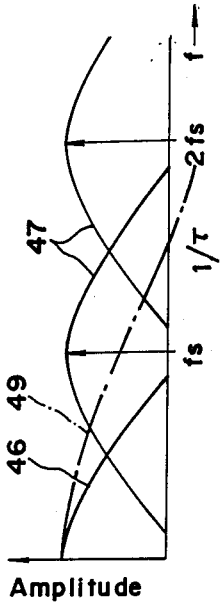
Figure 6A:
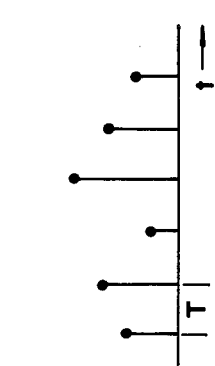
Figure 6C:
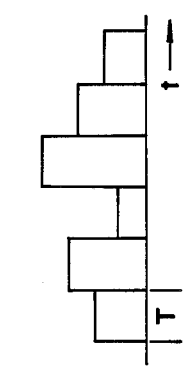
Figure 6E:
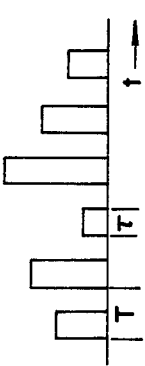
Figure 14A:
Figure 14B:
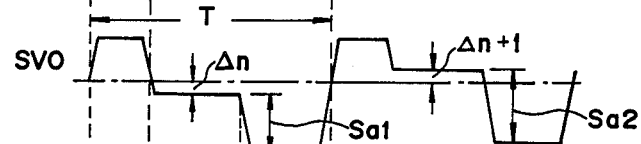

When a precharge pulse Pp shown in FIG. 14A is supplied to the floating diffusion amplifiers 105a, 105b, 105c and 105d of FIG. 12, the floating diffusion amplifier 105a, for example, produces an output signal $SV_O$ shown in FIG. 14B. The operation performed in this case is the same as described previously with reference to FIG. 2.

Figure 14C:
Figure 14D:
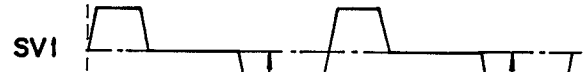

A clamp pulse Pc supplied to the clamp circuits 111a to 111d becomes a high level during the reference potential time To as shown in FIG. 14C, and the switching element 113 is turned on during the high-level time of the clamp pulse Pc. And the level (feed-through level) during the reference potential time To is clamped to a predetermined clamp voltage by the clamp circuit 111a. Consequently, as shown in FIG. 14D, the output signal SV1 of the clamp circuit 111a contains none of the reset noises Δn, Δn+1 and so forth due to the removal thereof.

Figure 14E:
Figure 14F:
Figure 14G:
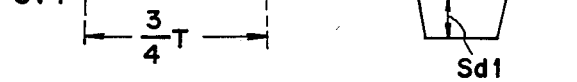

The above operation of removing such reset noises is performed also by the other clamp circuits 111b, 111c and 111d. Since the output signal of the clamp circuit 111b is fed via the delay circuit 116, it becomes a signal SV2 having a delay of T/4 from the signal SV1 as shown in FIG. 14E. Similarly, the output signal of the clamp circuit 111c fed via the delay circuit 117 becomes a signal SV3 having a delay of T/2 from the signal SV1 as shown in FIG. 14F. Meanwhile the output signal of the clamp circuit 111d fed via the delay circuit 118 becomes a signal SV4 having a delay of 3T/4 from the signal SV1 as shown in FIG. 14G.

Figure 14H:
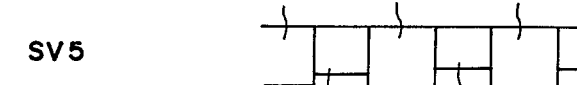

Such CCD output signals SV1, SV2, SV3 and SV4 are supplied to the non-additive mixer 119, so that the great amplitude portions thereof during the precharge time Tp are removed and are therefore not existent in the output signal SV5 of the mixer 119 as shown in FIG. 14H. And the information signal voltages Sa1, Sb1, Sc1, Sd1 and so forth are rendered continuous with the period T/4. Accordingly, the output signals of the four horizontal registers 104a, 104b, 104d are combined with one another by the non-additive mixer 119 to form an image pickup signal of one channel.

Sample-and-hold circuits 123a, 123b, 123c and 23d (FIG. 11) are connected via a switch 122 to the output terminal of the amplifier 120 supplied with the output signal of the non-additive mixer 119. The sample-and-hold circuits 23a to 123d are supplied with sampling pulses $\phi a$, $\phi b$, $\phi c$ and $\phi d$ respectively. Comparative amplifiers 124, 125 and 126 are provided for detecting the gain difference or black level difference between one signal channel as a reference and each of the other three signal channels. The signal channel including the amplifier 110a is selected as the reference signal channel. Therefore the output signal of the sample-and-hold circuit 123a is supplied to one input terminal of each of the comparative amplifiers 124, 125 and 126, while the output signals of the sample-and-hold circuits 123b, 123c and 123d are supplied to the other input terminals of the comparative amplifiers 124, 125 and 126, respectively.

The error signals outputted from the comparative amplifiers 124, 125 and 126 are supplied to averaging circuits 127, 128 and 129, respectively. The averaging circuits 127, 128 and 129 serve to smoothen the error signals in one field duration, and a vertical synchronizing signal is supplied from a terminal 130 to such averaging circuits 127, 128 and 129. The error signals thus averaged by the circuits 127, 128 and 129 are stored in a memory 131. Although an analog memory is employed as the memory 131 in the example shown in FIG. 11, it may be replaced with a digital memory as well. However, in the case of using a digital memory, an A-D converter is required for converting into a digital signal the error signal which is to be written in the memory 131, and further a D-A converter is also required for converting into an analog error signal the digital signal read out from the memory 131.

The memory 131 comprises memory portions 132b and 133b for storing the error signal obtained from the averaging circuit 127, memory portions 132c and 133c for storing the error signal from the averaging circuit 128, and memory portions 132d and 133d for storing the error signal from the averaging circuit 129. And a switch 134 is provided in relation to the memory 131.

The error signal relative to the gain is stored in the memory portions 132b, 132c and 132d, while the error signal relative to the black level is stored in the memory portions 133b, 133c and 133d.

The error signals read out from the memory portions 132b, 132c and 132d respectively are supplied as gain control signals to the variable gain amplifiers 110b, 110c and 110d, whereby the gain of the signal channel including the amplifier 110a is equalized to the respective of the other three signal channels. The error signals read out from the memory portions 133b, 133c and 133d respectively are supplied as control signals to the variable voltage sources 114b, 114c and 114d. Then the values of clamp voltages are controlled by the variable voltage sources 114b, 114c and 114d respectively, whereby the black levels are so controlled as to be equalized among the four channels. The switch 134 is provided for selecting a gain adjustment mode or a black level adjustment mode. For example, the switch 134 is turned on to select the black level adjustment mode.

In the gain adjustment mode, the image of an entirely white subject is picked up by a color camera, and the CCD output signal is introduced via the on-state switch 122 to the sample-and-hold circuits 123a to 123d. As shown in FIG. 15A, the level of the CCD output signal produced in picking up the image of the entirely white subject fails to be uniform among the four signal channels due to the existence of gain dispersions. Sampling pulses $\phi a$, $\phi b$, $\phi c$ and $\phi d$ of FIG. 15B are supplied respectively to the sample-and-hold circuits 123a to 123d, which then detect the individual white levels of the four signal channels.

The output signals of the sample-and-hold circuits 123a to 123d are supplied to the comparative amplifiers 124, 125 and 126, so that the level difference is detected between the output signal of the sample-and-hold circuit 123a and that of each of the sample-and-hold circuits 123b, 123c and 123d. The one-field average values of the output signals of the comparative amplifiers 124, 125 and 126 are written in the memory portions 132b, 132c and 132d of the memory 131. The switch 122 is turned off upon completion of the setting operation, and the error signals read out from the memory portions 132b, 132c and 132d respectively are supplied as control signals to the variable gain amplifiers 110b, 110c and 110d. Then the gains in the individual channels are equalized to one another by the variable gain amplifiers 110b, 110c and 110d. Consequently, if the image of the entirely white subject is picked up after completion of the setting operation, the output signal levels in the individual channels are equalized to one another.

In the black level adjustment mode, the iris diaphragm of the color camera is completely closed, and the switches 122 and 134 are both turned on. Then the black levels are detected and compared as in the aforementioned gain adjustment mode, and the error signals are written in the memory portions 133b, 133c and 133d of the memory 131. Subsequently the variable voltage sources 114b, 114c and 114d are controlled in accordance with the error signals read out from the memory 131, so that the black levels in the four channels are rendered coincident with one another.

Once the setting is so carried out as to eliminate the differences among the gains or black levels in the individual channels, substantially no variation occurs thereafter except the secular change in the circuit. Consequently, the gain or clamp voltage is controllable by manually adjusting a variable resistor or the like, and adjustment may be so executed as to render the levels in the individual channels coincident with one another while measuring the CCD output signal obtained from the output terminal 121. It is generally customary that such presetting adjustment is carried out when the product is shipped from the factory.

As described hereinabove, according to this embodiment where the output signals of a plurality of horizontal registers are supplied to clamp circuits respectively, any random noise such as reset noise can be removed by the clamp circuits. Also in this embodiment, the output signals of the clamp circuits are supplied to the non-additive mixer after being delayed for mutually different lengths of time, whereby the information signal voltages can be taken out without the necessity of using sample-and-hold means to eventually prevent aliasing of the thermal noise in a higher frequency band of the output signal, hence improving the signal-to-noise ratio. Furthermore, the circuit configuration is simplified since the output signals of the horizontal registers can be combined with one another by the non-additive mixer.

What is claimed is:

1. An output signal processing circuit for a CCD having an output terminal and an output precharge circuit with capacitive means and being driven by a CCD-driving clock signal of a given frequency, the voltage across said capacitive means being supplied to said output terminal of said CCD and having first, second and third durations repeatedly, said first duration being a precharge duration when a precharge pulse produced at the same frequency as that of said CCD-driving clock signal is supplied to said output precharge circuit, said second duration being a reference duration when the voltage across said capacitive means is kept substantially at a reference voltage determined by said output precharge circuit, and said third duration being a signal duration when said capacitive means is discharged to the level of a transferred signal, said output signal processing circuit comprising:
    clamp circuit means for clamping the output signal at the output terminal of said CCD in such a manner that the voltage of said reference duration becomes a stable clamp voltage;
    clip circuit means for clipping the output signal of said clamp circuit means so that the voltage of said precharge duration is clipped to a clip voltage; and
    low-pass filter means supplied with the output of said clip circuit means for generating the transferred signal.

2. An output signal processing circuit according to claim 1, wherein said clip circuit means maintains said clip voltage substantially at the level of said clamp voltage.

3. An output signal processing circuit according to claim 2, wherein said clip circuit means includes a level clip circuit for producing an output, delay means for delaying the output of said level clip circuit to generate at least one delayed output signal, and non-additive mixing circuit means supplied with the output signal of said level clip circuit and the delayed output signal for producing a combined information signal.

4. An output signal processing circuit according to claim 3, wherein said delay means causes a delay which is less than one period of said CCD-driving clock signal.

5. A solid-state video camera comprising:
    a solid-state image pickup device of charge coupled type (CCD type) including photo-sensitive elements arranged into a matrix;
    a plurality of vertical shift registers for shifting charges generated in said photo-sensitive elements in a vertical direction;
    a plurality of horizontal shift registers each shifting a charge from a selected one of said vertical shift registers in a horizontal direction and generating a pulsed video information signal having a precharge duration, a reference duration and a signal duration repeatedly;
    a plurality of output signal processing circuits connected to said horizontal shift registers respectively and each including a clamp circuit for clamping said pulsed video information signal in such a manner that the voltage of said reference duration becomes a stable clamp voltage;
    a plurality of selective delay means respectively supplied with the outputs of the clamp circuits for selectively delaying the same so that the delays imparted to the individual outputs of said clamp circuits become different from one another; and
    non-additive mixing circuit means supplied with the outputs of said selective delay means for generating a combined video information signal.

6. A solid-state video camera according to claim 5, further comprising white level detecting means responsive to said combined video information signal for detecting the white levels of said pulsed video information signals and
    gain controlled amplifier means connected between said horizontal shift registers and said clamp circuits respectively and controlled by said white level detecting means in such a manner that the white levels of said pulsed video information signals become equal to one another.

7. A solid-state video camera according to claim 5, further comprising black level detecting means responsive to said combined video information signal for detecting the black levels of said pulsed video information signals and generating control outputs for controlling the clamp voltages so that the black levels of said pulsed video information signals become equal to one another.

* * * * *